(12) United States Patent
Yoo et al.

(10) Patent No.: US 7,522,464 B2
(45) Date of Patent: Apr. 21, 2009

(54) DYNAMIC MEMORY REFRESH CONFIGURATIONS AND LEAKAGE CONTROL METHODS

(75) Inventors: Seung-Moon Yoo, Cupertino, CA (US);
Myung Chan Choi, San Jose, CA (US);
Sangho Shin, San Ramon, CA (US);
Sang-Kyun Han, Sunnyvale, CA (US)

(73) Assignee: ZMOS Technology, Inc., San Jose, CA (US)

( * ) Notice: Subject to any disclaimer, the term of this patent is extended or adjusted under 35 U.S.C. 154(b) by 0 days.

(21) Appl. No.: 11/779,716

(22) Filed: Jul. 18, 2007

(65) Prior Publication Data
US 2008/0031068 A1    Feb. 7, 2008

Related U.S. Application Data

(60) Provisional application No. 60/833,599, filed on Jul. 26, 2006.

(51) Int. Cl.
*G11C 7/00*   (2006.01)
(52) U.S. Cl. .................. 365/222; 365/200; 365/205; 365/233
(58) Field of Classification Search ............... 365/222, 365/200, 203, 205, 233
See application file for complete search history.

(56) References Cited

U.S. PATENT DOCUMENTS

| | | | | |
|---|---|---|---|---|
| 6,834,021 | B2* | 12/2004 | Mori et al. | 365/222 |
| 7,139,208 | B2* | 11/2006 | Arimoto et al. | 365/222 |
| 7,203,115 | B2* | 4/2007 | Eto | 365/222 |
| 7,295,482 | B2* | 11/2007 | Kang et al. | 365/203 |

* cited by examiner

*Primary Examiner*—David Lam
(74) *Attorney, Agent, or Firm*—John P. O'Banion (57) ABSTRACT

Dynamic Random Access Memory (DRAM) circuits and methods are described for reducing leakage and increasing repaired yield. These objects are accomplished according to the invention by grouping refresh cycles within a single activation of power control, the use of limiting circuits or fuses to mitigate power losses associated with micro-bridging of bit-lines and word-lines, modulating the bit-line voltage at the end of precharge cycles, configuring refresh control circuits to use redundant word-lines in generating additional refresh cycles for redundant rows of memory cells, and combinations thereof. In one aspect, word-line fuses indicate modes of use as: unused, replacement, additional refresh, and replacement with additional refresh. The refresh control circuit utilizes these modes in combination with the X-address stored in the word-line fuses for controlling the generation of additional refresh cycles toward overcoming insufficient data retention intervals in select memory cell rows.

21 Claims, 11 Drawing Sheets

U/R: Unused/Replacement
RCI: Refresh Cycle Information

DYNAMIC MEMORY REFRESH CONFIGURATIONS AND LEAKAGE CONTROL METHODS

CROSS-REFERENCE TO RELATED APPLICATIONS

This application claims priority from U.S. provisional application Ser. No. 60/833,599, filed on Jul. 26, 2006, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to semiconductor memory, and more particularly to control circuits within dynamic random access memories (DRAMs).

2. Description of Related Art

Dynamic Random Access Memory (DRAM) circuits and devices have been utilized as main memory for servers, personal computers, and a wide range of other electronic devices.

Figure 1A:
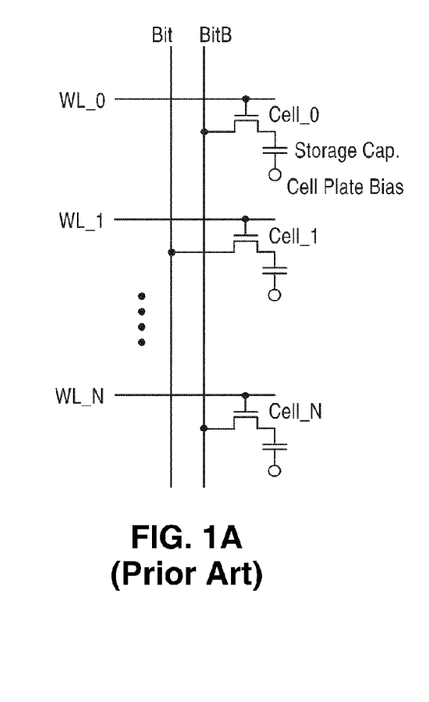
FIG. 1A-1B are schematics of a conventional DRAM structure showing a switch coupled to a charge storage element and a CMOS latch within a sense amplifier, respectively.
Figure 1B:
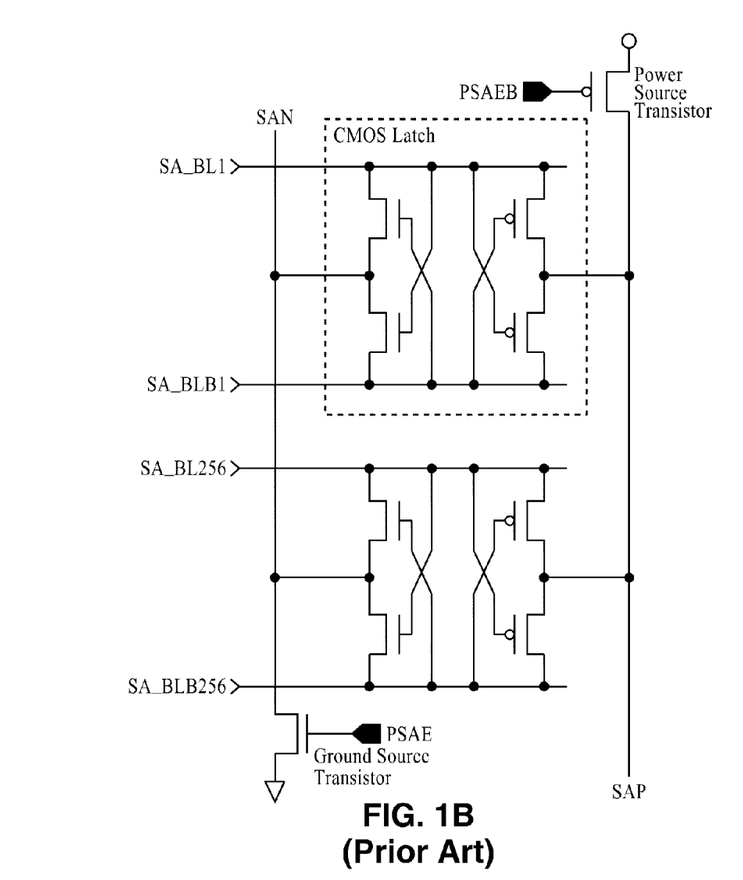

A conventional DRAM comprises arrays of memory cells which each comprise a switching device coupled to a charge storage element as shown in FIG. 1A. The switch typically comprises a transistor, such as an NMOS transistor, while the storage device typically comprises a capacitor. The logic state of the cell ("1" or "0") is determined with respect to the level of charge stored on the capacitor, for example a "1" state is typically represented by the presence of charge, and a "0" state by its absence. The switch is activated for writing to the cell, or reading from the cell, and then is switched off so as to retain cell state. It will be recognized that over time the charge stored on the capacitor dissipates as a result of various forms of leakage. At some point in time the charge stored for the "1" cell state drops to that of the cells held in the "0" state, wherein memory data becomes lost. FIG. 1B depicts a typical sense amplifier section to which bit line pairs SA BL1, SA BLB1 through SA BL256, SA BLB256 are coupled. A CMOS latch portion is shown bounded by a dashed line, with power source and ground source transistors marked.

In response to this leakage, DRAM devices require incorporation of a periodic charge-restoring operation to maintain cell information. These charge-restoration operations are referred to as refresh operations, or cycles, such as performed by a memory controller, and more preferably by an internal memory controller performing what is referred to as self-refresh.

DRAM chips have different current consumption characteristics depending on operating mode. When a word-line is enabled for write or read operation it is in active mode, and in pre-charge state the word-line is disabled. Normally, the current consumption during pre-charge state is less than during active mode and consists of standby current for the DC generator, leakage current in core and peripheral circuits, and current used by circuits that detect changes in the chips operating mode. As chip density increases and process technology shrinks, more leakage paths arise during standby state, such as in the case of micro-bridges, which are created in response to process defects.

Normally, when a micro-bridge arises between a word-line and a bit-line, the corresponding cell cannot be used and the associated row (or column) of memory cells is replaced with another using a redundant row (or redundant column). In response to utilizing this repair cell, the cell density and functionality of the device as originally intended can be maintained. However, during stand-by state, the bit-line of the defective cell is at Vblp level and the word-line is at a certain predetermined stand-by level. Typically, the stand-by level of the word-line is 0V, or less, to keep the NMOS cell access transistor in an off state to maintain cell data. Thus, a leakage path exists between the bit-line and word-line through the micro-bridge. The bit-line level is provided by a Vblp generator, wherein the leakage current flows from the Vblp generator to ground or to the negative bias generator connected to the word-line. Therefore, micro-bridges contribute to increases in standby current and thus indirectly still result in lower factory yields.

A DRAM contains many word-lines, bit-lines, and storage cells which are subject to process defects and variation. As a consequence of these defects and variations, a certain portion of the memory storage cells do not function properly, or have inadequate retention time according to chip specification. Currently, the rows of faulty memory cells cannot be used for write/read functions regardless of whether the row is completely non-functional or merely suffers from insufficient data retention period (less than the specified retention duration).

In order to replace the rows of memory associated with these defective cells, a certain number of redundant (extra) storage cells, redundant word-lines, and redundant bit-lines are built into each DRAM chip to access these spare cells. When using a redundant word-line, the information that enables the redundant word-line is the address of the corresponding defective word-line, and this address, referred to as an X-address, is stored in a physically or electrically programmable fuse.

In conventional memory repair methods, each of these redundant word-lines is only usable for row repair when all of the redundant memory cells contained within the associated row are functional (not defective) and have cell retention times that meet specification. However, like the original rows of memory cells, a portion of these redundant rows are also generally unusable due to retention time issues. Therefore, since the number of redundant rows is limited, a certain proportion of memory chips are not able to be repaired to meet first bin specifications according with these conventional memory repair methods, and thus these chips are either downgraded or disposed of.

Accordingly, a need exists for circuits and methods for reducing self refresh and leakage power consumption while improving self refresh characteristics within memory circuits, and in particular dynamic memory circuits. These needs and others are met within the present invention, which overcomes the deficiencies of previously developed circuits and methods.

BRIEF SUMMARY OF THE INVENTION

Circuits and methods are described for enhancing dynamic memory characteristics in response to the use of power source transistors, altering the refresh configuration and/or controlling circuit and cell leakage. At least one implementation describes the use of a burst mode refresh means which reduces power switching losses within dynamic memory. At least one implementation describes a means for reducing leakage arising from micro-bridging between bit and word-lines with current limiting means and fuse means. At least one implementation describes reducing unit cell leakage in response to adapting bit-line voltage profiles. At least one implementation describes a means for improving self refresh characteristics of those memory cells having a data retention time that is shorter than other memory cells by storing its address information in unused programmable fuses for redundant cells and altering its refresh period.

An example of the invention is a dynamic random access memory circuit (DRAM), comprising: (a) a plurality of memory cells configured for retaining cell data in response to the level of stored charge; (b) a plurality of bit-lines and word-lines coupled to the plurality of memory cells for accessing cell data; (c) a refresh circuit configured for grouping refresh cycles into a portion of the retention period; (d) a power control circuit configured for generating a power control signal for deactivating power when the memory circuit is not being accessed; and (e) the power control circuit configured for generating an active power level while the grouping of refresh cycles is being performed. As a result, the power control signal is not switched on and off for each refresh cycle within the retention period, thus reducing power consumption, such as in response to lowered capacitive charging and discharging.

The refresh cycles are grouped within a portion which is less than half of the retention period for the dynamic memory. These refresh cycles are not evenly distributed over the data retention period, but within clusters, or groups, between which no refresh cycles are being executed. Each of these refresh cycles comprises refreshing a memory cell once within a given data retention period, which is preferably performed by reading data from a memory cell followed by writing the same data back into the memory cell. This refresh reading and writing is performed in response to modulation of bit-lines and word-lines of the memory circuit. In a preferred implementation, the refresh cycles are controlled by self-refresh circuitry within the memory circuit which generates the timing of the refresh cycles within the portion of the data retention period. Internal power control signals are activated before a grouping of refresh cycles is performed, and deactivated afterward, for reducing overall power consumption. The power control signal comprises a signal that when activated turns on at least selected portions of internal power sources, and when deactivated turns off at least selected portions of internal power sources.

Another example of the invention is a dynamic random access memory circuit (DRAM), comprising: (a) a plurality of memory cells configured for retaining cell data in response to the level of stored charge; (b) a plurality of word-lines coupled to cell arrays within the plurality of memory cells; (c) a plurality of bit-lines coupled through sense-amplifier arrays to the plurality of memory cells for accessing cell data; (d) a refresh circuit configured for controlling refresh cycles in which the plurality of memory cells are refreshed within a retention period for the memory cells; and (e) a current limiting circuit coupled between the bit-line and the plurality of sense-amplifiers arrays; (f) the current limiting circuit configured to reduce standby current flow through micro-bridges between the bit-lines and the word-lines of the memory circuit. The current limiting circuit limits the amount of current which can flow through the bit-line. Alternatively the current limiting circuit can be connected at the input of each sense-amplifier array in the plurality of sense-amplifier arrays, or coupled at the output of the bit-line precharge voltage generator, or a combination thereof. By way of example, and not limitation, the current limiting circuitry can comprise NMOS and/or PMOS transistors.

Another example of the invention is a dynamic random access memory circuit (DRAM), comprising: (a) a plurality of memory cells configured for retaining cell data in response to the level of stored charge; (b) a plurality of word-lines coupled to cell arrays within the plurality of memory cells; (c) a plurality of bit-lines coupled through sense-amplifier arrays to the plurality of memory cells for accessing cell data; (d) a refresh circuit configured for controlling refresh cycles in which the plurality of memory cells are refreshed within a retention period for the memory cells; and (e) a current limiting circuit coupled to a plurality of bit-line equalizing circuits of the plurality of sense-amplifier arrays to limit standby current flow through micro-bridges between the bit-lines and the word-lines of the memory circuit.

In one configuration, the current limiting circuit enters a non-conductive state in response to a flow of current exceeding a predetermined value, for example the current limiting circuit can permanently enter the non-conductive state, such as in the manner of a fuse. Configurations include coupling the current limiting circuit to the common input to each bit-line equalizing circuit, and/or to more than one bit-line equalizing circuit.

Another example of the invention is a dynamic random access memory circuit (DRAM), comprising: (a) a plurality of memory cells configured for retaining cell data in response to the level of stored charge; (b) a plurality of word-lines coupled to cell arrays within the plurality of memory cells; (c) a plurality of bit-lines coupled through sense-amplifier arrays to the plurality of memory cells for accessing cell data; (d) a plurality of redundant memory cells and word-lines which are enabled for replacing memory cells and word-lines which are defective; and (e) a refresh control circuit configured for controlling refresh cycles in which the plurality of memory cells are refreshed within a retention period for the memory cells; (f) wherein at least a portion of the redundant word-lines are utilized to increase the number of refresh cycles arising per retention period and directed to the associated rows of memory cells.

In one configuration a fuse is associated with each of the redundant word-lines. Each of these fuses is configured with an X-address and a means for indicating whether the word-line is unused, used for repair, used for refresh period control, or used for both repair and refresh period control. In response to the fuses for a given redundant word-line being set for refresh period control, or a combination of refresh and replacement, the refresh control circuit is configured for utilizing the X-address for establishing an additional refresh cycle within each retention period for maintaining data within memory cells having an insufficient retention period. In one configuration, the fuses are configured for row repair and have been left un-programmed after row repair programming. In one mode, these fuses are programmed with X-addresses of word-lines to be controlled and information indicating that the fuses are being used for refresh period control and not for row repair. In another mode, these fuses are programmed with row repair information and information indicating that the fuses are being used for refresh period control in addition to row repair. In one mode, the information programmed into the fuses is used to refresh certain word-lines multiple times during one refresh cycle. In one mode, the information programmed in the fuses is used to refresh the repaired word-lines multiple times during one refresh cycle.

Another example of the invention is a dynamic random access memory circuit (DRAM), comprising: (a) a plurality of memory cells configured for retaining cell data in response to the level of stored charge; (b) a plurality of word-lines coupled to cell arrays within the plurality of memory cells; (c) a plurality of bit-lines coupled through sense-amplifier arrays to the plurality of memory cells for accessing cell data; (d) a refresh circuit configured for controlling refresh cycles in which the plurality of memory cells are refreshed within a retention period for the memory cells; and (e) a means for changing the gate-to-source potential on at least one of the bit-lines near the end of a memory cell precharge cycle.

At least one of the bit-lines preferably comprises BitB whose voltage is changed, in this case lowered, such as from Vsg to Vss prior to the end of the precharge cycle. In one mode, the source potential of the memory cell transistor is retained at a higher potential than the gate. By way of example, the source potential is higher than zero volts, while the gate potential is lower than or equal to zero volts. In one configuration the difference in gate-to-source potential is controlled by a sensing circuit that reads the cell data. For example, the sensing circuit may comprise a bit-line sense-amplifier, such as a CMOS latch and power and/or ground source transistors of the CMOS latch. The ground source transistor, or transistors, can be configured to connect the common node of two NMOS transistors within the CMOS latch, to ground. In one mode, the potential of the common node changes according to operating mode. The potential of the common node is preferably at a certain precharge level which is higher than ground potential and lower than Vcore during a precharge period. The precharge level is preferably configured at a level of approximately Vcore/2. In one mode, the common node potential is at ground during row activation for data read or write operation. In one mode, the potential of the common node is at a predetermined level which is higher than ground potential and lower than the precharge level during row activation for refresh operation and goes to ground potential at a selected time before precharge operation. The potential of the common node is at a certain level higher than ground, and lower than precharge level, during row activation for self-refresh operation and goes to ground at a certain time before precharge operation.

Further aspects of the invention will be brought out in the following portions of the specification, wherein the detailed description is for the purpose of fully disclosing preferred embodiments of the invention without placing limitations thereon.

An aspect of the invention is the mitigation of leakage sources within DRAMs.

Another aspect of the invention is reducing power consumption associated with the switching of power during refresh cycles in DRAM devices.

Another aspect of the invention is the grouping of DRAM refresh cycles within a portion of the retention period.

Another aspect of the invention is the modulation of circuit power, when the circuit is in a standby mode, so that power is applied only during the group of refresh cycles.

Another aspect of the invention is to prevent switching on and off of the power control signal for each refresh cycle within the retention period.

Another aspect of the invention is to group refresh cycles into a portion of the retention period which is less than one-half, or more preferably, one-quarter, of the retention period.

Another aspect of the invention is to provide refresh cycle grouping and power control within self-refresh circuitry which controls the timing.

Another aspect of the invention is directed at reducing leakage arising in response to circuit shorts, such as micro-bridges arising between bit and word-line.

Another aspect of the invention is to integrate current limiting circuits between the bit-lines and the sense-amplifiers to control power consumption in response to micro-bridges arising between the bit-lines and sense-amplifiers.

Another aspect of the invention is to connect the current limiting circuit to the input of each sense-amplifier array.

Another aspect of the invention is to connect the current limiting circuit at the output of the bit-line precharge generator.

Another aspect of the invention is to couple current limiting circuitry to a plurality of bit-line equalizing circuits within the sense-amplifier arrays to limit standby current flow.

Another aspect of the invention is current limiting circuitry which enters a non-conductive state in response to a flow of current exceeding a predetermined value.

Another aspect of the invention is current limiting circuit which permanently enters a non-conductive state.

Another aspect of the invention is directed towards improving refresh periods utilizing redundant word-line fuses.

Another aspect of the invention is for improving refresh periods by generating multiple refresh cycles on memory cell rows in response to utilization of redundant word-lines in a refresh, or refresh and replace, mode.

Another aspect of the invention is the use of word-line fuses to indicate/control if a word-line is unused, used for repair, used for refresh period control, or used for both repair and refresh period control.

A still further aspect of the invention is a means for changing gate-to-source potential on at least one bit-line near the end of a memory cell precharge cycle.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 2 through FIG. 15. It will be appreciated that the apparatus may vary as to configuration and as to details of the parts, and that the method may vary as to the specific steps and sequence, without departing from the basic concepts as disclosed herein.

1. Grouping of Refresh Cycles.

A DRAM cell, in absence of any intervention, loses its stored bit information as charge escapes through leakage paths. Therefore, data must be periodically rewritten to the cells in a refresh operation in order to maintain the stored information. In a refresh operation data is read from the cell and then the same data is rewritten into the cell thus recharging the charge storage element (e.g., capacitor), for example to an initial (full) level of charge for a "1" state, or fully depleting it for a "0" state. The present invention is more particularly directed to the use of internal refresh (self-refresh) operations in which refresh is performed in response to internally generated commands and not as a result of refresh commands received from external circuits.

A self-refresh circuit, or circuitry, within the memory is configured for controlling the timing of the grouping of the refresh cycles. During self-refresh, the chip refreshes each cell once every tRETEN as calculated during the design phase to ensure the data integrity of each cell. Time period tRETEN indicates the maximum amount of time a cell can correctly retain data without a refresh operation.

Figure 2:
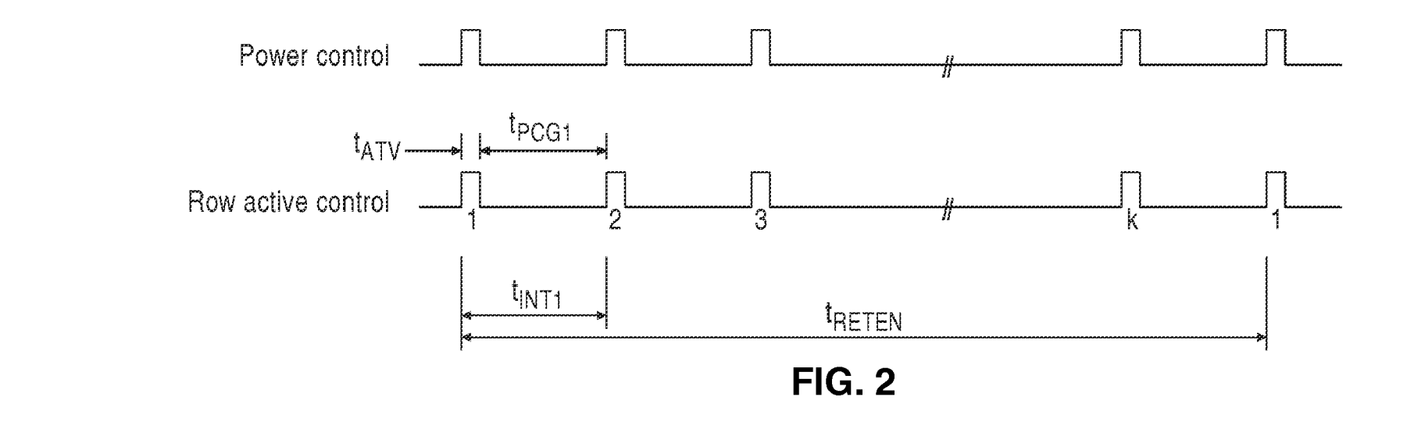
FIG. 2 is a timing diagram of distributed refresh operations within a DRAM memory utilizing cycled power control signals during self-refresh.

FIG. 2 illustrates modulation of the power control signal during self-refresh for a distributed self-refresh circuit in order to reduce leakage current. As can be seen in the figure, the power control signal is enabled immediately prior to the refresh (row activation) and is disabled as soon as refresh finishes to minimize the leakage current during time period tPCG1. In this example, K refresh (row activation) occurs during tRETEN so that the power control signal will switch K times, with the chip consuming a certain amount of current as a result of the switching, in particular capacitive charging and discharging of the power source transistors during switching. Therefore, power is still consumed by the DRAM during these operations, in particular in view of the high densities and increased leakage current as cell geometries are continually scaled down.

In the above distributed refresh configuration, if K refresh cycles (row activations) are internally required to refresh every cell in the chip, each of the K refresh cycles are spaced at an interval tINT1=tRETEN/K. Power control in this circuit is provided by utilizing power source transistors, which reduce leakage current by modulating power.

Furthermore, the present invention provides a burst mode power modulation technique in which power is modulated through the power source transistors to reduce leakage currents from, or to, VDD/VSS. Specifically, in order to reduce leakage current, power source transistors are used (PMOS or NMOS for VDD/VSS) and burst refresh mode is applied for utilizing source transistors which cut off leakage current during self refresh operation and which can reduce dynamic self refresh power consumption by eliminating frequent activation and deactivation of source transistors.

In response to this configuration memory is optimized toward reducing the switching of power through the source transistors and thus avoiding the dynamic power consumption that arises as a result of capacitive discharging. Furthermore, in one mode of the invention, memory cells are classified into one or more groups with the refresh control circuits able to support different refresh periods for each of the groups.

In prior memory chip designs, the refresh period was limited by the memory cells having the worst refresh characteristics (i.e., requiring most frequent refresh). However, the present memory device embodiment controls the refresh period to reduce dynamic self refresh power consumption. For example, consider four cells of the memory in which three cells have a refresh period of two seconds and one cell has a refresh period of only one second. In prior memory devices, all cells would thus have to be refreshed at one second intervals, or less, with a total of eight refresh operations being generated over a two second period. Yet in the present memory embodiment, the three cells with the two second refresh period can be grouped into Group A, while the one cell with the one second refresh period can be grouped into Group B. Only the memory cells in group B cell are refreshed every second. Accordingly, five refresh operations are generated in a two second period. It will be appreciated, therefore, that fewer self refresh operations are necessary wherein dynamic refresh power consumption is reduced while maximizing the use of available memory cells.

Figure 3:
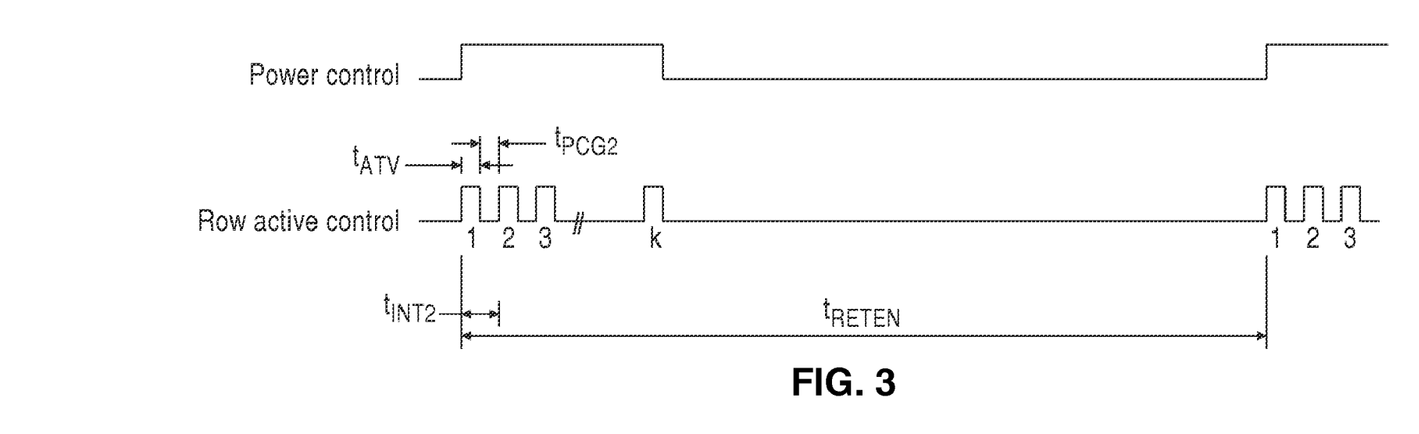
FIG. 3 is a timing diagram of group mode refresh operation according to an embodiment of the present invention, shown with power control signals being cycled during self-refresh.

FIG. 3 illustrates an example refresh method according to the invention for reducing the current expended for power control switching within the DRAM. In this method, instead of having the K necessary refresh cycles distributed uniformly during tRETEN, the refreshes are performed rapidly together in a group one after the other within a portion of the retention period, preferably keeping tINT2 as small as possible. Preferably, the portion of the retention period into which the cycles are grouped is less than ½ the retention period and more preferably less than ⅛-¼ of the retention period. It will be appreciated that the grouping of refresh cycles need not be limited to a single group, but can be grouped into a small number of groups within the retention period, such as between 2-6, although less switching power will be saved in this manner.

The power control signal is enabled immediately prior to the first refresh in the group of refreshes and is disabled only after the group of refreshes is complete, such as after the K refreshes are finished. The refresh cycles are terminated if an external command is received requiring self-refresh mode to be exited. If the self-refresh period is longer than tRETEN, then the power control signal which was disabled after K refreshes is enabled again after tRETEN and remains enabled until K refreshes have been performed. It should be appreciated that the power control signal can be configured to activate power for the entire memory, or a selected portion of the memory, such as if it is segmented into different regions. The power control signal thus activates and deactivates at least selected portions of internal power sources within the memory circuit.

According to this refresh scheme the power control signal is only switched once during tRETEN and therefore switching current consumption is substantially reduced. However, leakage current will flow during tPCG2.

To compare the current consumption for the two cases let:
Iswitch=power control signal switching current, and
Ileak_pcg=leakage current when power control signal is enabled.

Then, the proposed self-refresh method will consume less power if:

$$K \times Iswitch > Iswitch + (Ileak\_pcg \times tPCG2 \times K)/tRETEN.$$

2. Reducing Vblip Leakage During Stand-By State.

FIG. 4 through FIG. 7 illustrate example methods for reducing leakage from the Vblp generator due to micro-bridging between a word-line and a bit-line. These methods limit the maximum current flow through the power lines that connect the Vblp generator to the sensing amplifier arrays during standby mode.

Figure 4:
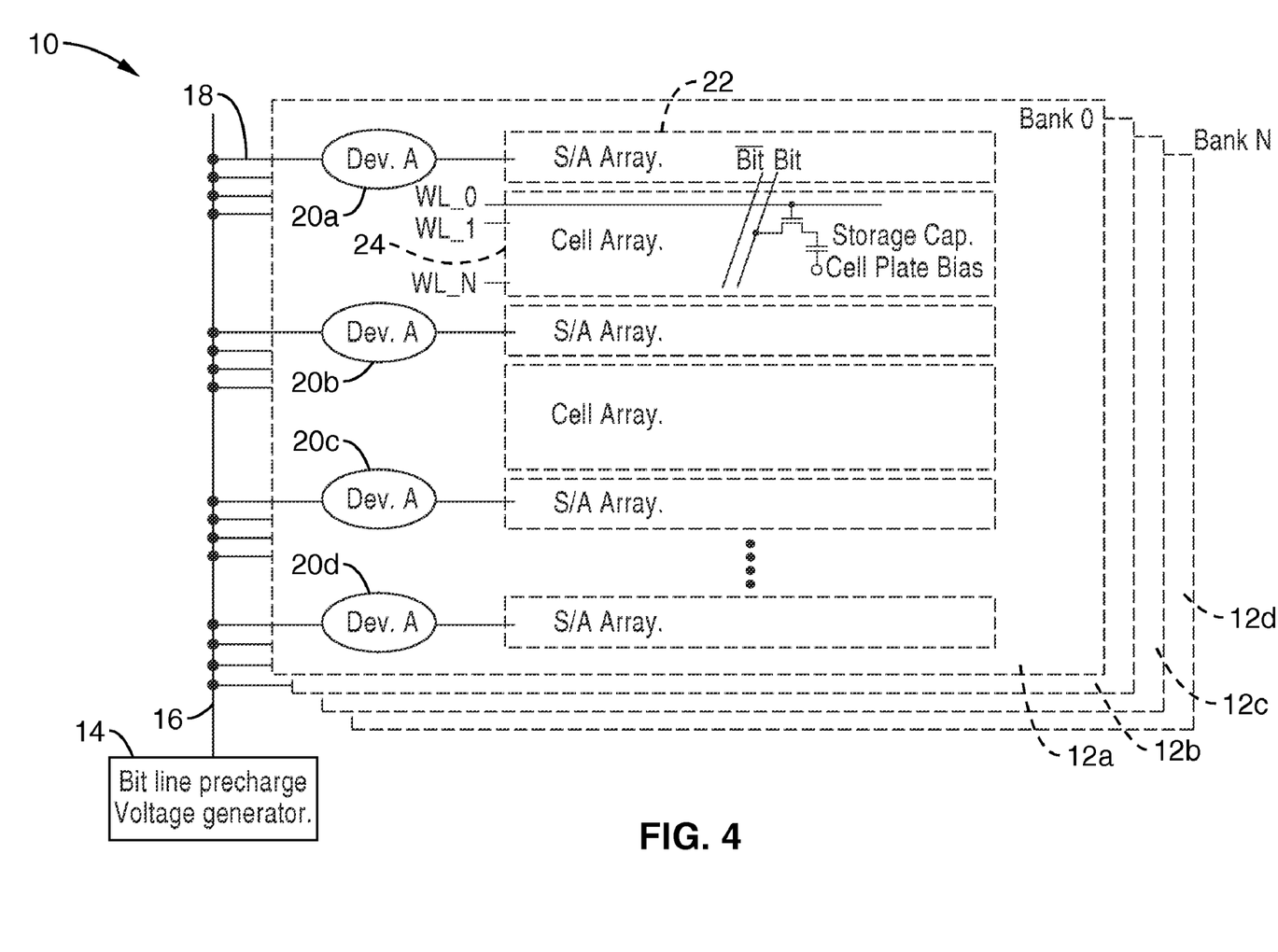
FIG. 4 is a schematic block diagram of separate current limiting means utilized to reduce leakage current from a Vblp generator according to an embodiment of the present invention.

In FIG. 4 a first method 10 is represented in which a current limiting means, within Bank 0 (12a) is shown in relation to similar additional banks (12b-12d). A bit-line precharge voltage generator (Vblp generator) is shown 14 as a precharge signal to bit lines 18. The current limiting means is referred to herein as a circuit called Dev. A (20a - 20d), is coupled at the input of each sensing amplifier array 22 to limit the current during standby mode to a desired level. For example, if a word-line to bit-line micro-bridge exists in the first sense-amplifier array 22 or memory cell array 24 of Bank 0, Dev. A (20a-20d) will limit the leakage current from this sense-amplifier array 22 to a predetermined value.

Figure 5:
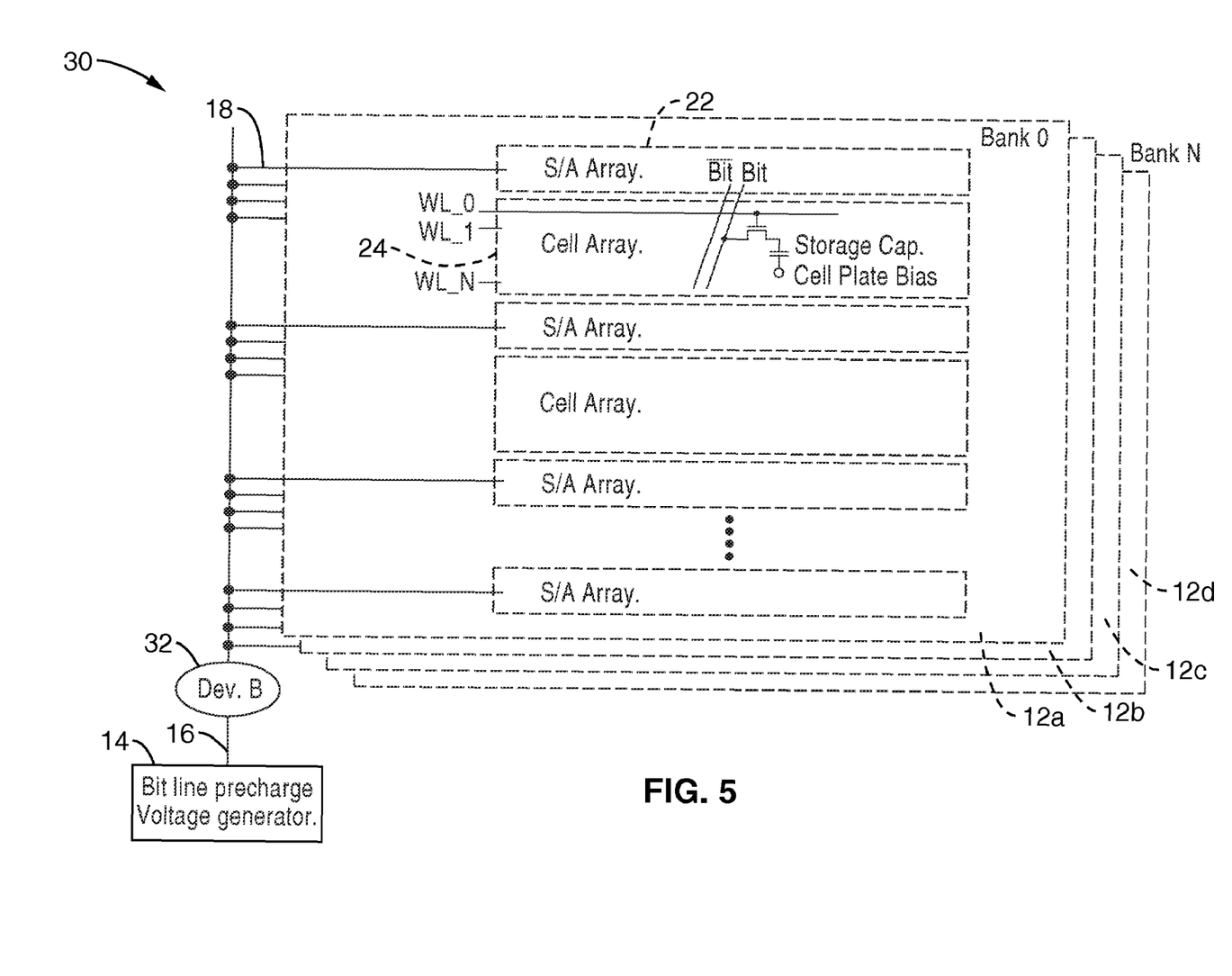
FIG. 5 is a schematic block diagram of a common current limiting means utilized to reduce leakage current from a Vblp generator according to an embodiment of the present invention.

In FIG. 5 a second method 30 is represented which places a circuitry Dev. B (32), at the output of Vblp generator 14 coupled with signal 16 in connection with bit lines 18. In this case, Dev. B (32) will limit the standby leakage current from the micro-bridges in the first sense-amplifier array 22 or memory cell array 24 to a predetermined value. In practice, any combination of Dev. A and Dev. B may be used to reduce the standby leakage current. Also in FIG. 5 are shown Banks 0 - N (12a - 12d).

Figure 6:
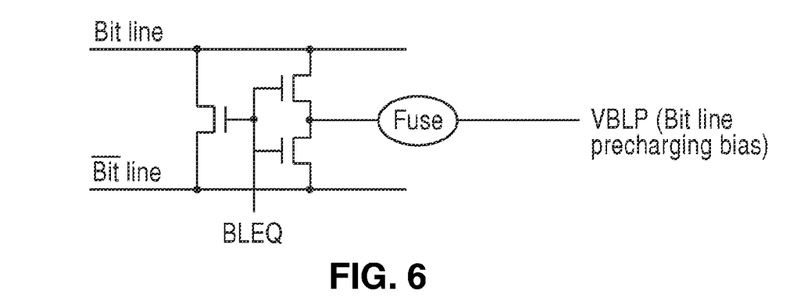
FIG. 6 is a schematic block diagram of separate fusing means utilized to prevent leakage current from a Vblp generator according to an embodiment of the present invention.

In FIG. 6 a third method is represented in which another current limiting circuit is integrated within each bit-line precharge circuit. This current limiting circuit disconnects the Vblp leakage path for each bit-line to word-line micro-bridge. The current limiting circuit preferably enters a non-conductive state in response to a flow of current exceeding a predetermined value. In at least one implementation, the non-conductive state is permanently entered by the current limiting circuit. By way of example the current limiting circuit may comprise a fuse or similar device.

Figure 7:
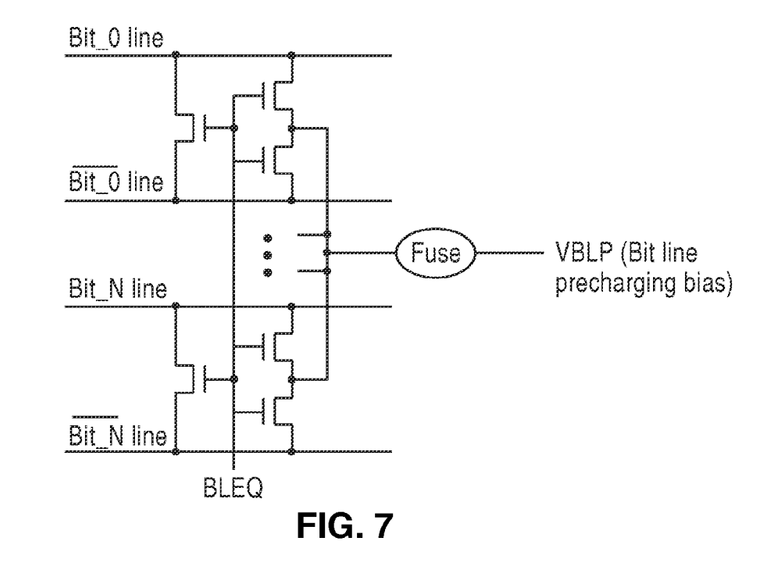
FIG. 7 is a schematic block diagram of a combined fusing means utilized to prevent leakage current from a Vblp generator according to an embodiment of the present invention.

In FIG. 7 a fourth method of limiting Vblp leakage is represented in which a current limiting circuit, such as configured for entering a non-conductive state in response to an excess current flow, (e.g., a fuse) is incorporated within the common Vblp bias line used by several bit-line pre-charge circuits.

It will be appreciated that the above aspects can be implemented in any desired combination, without departing from the teachings of the present invention.

3. Using Redundant Word-Line Fuses for Improving Refresh Period.

The present invention provides a mechanism for increasing the product yield by which memory chips can be repaired to specification with respect to self refresh current. The present aspect of the invention is able to utilize memory cells within the original rows and/or redundant rows which exhibit short retention times, without violating the retention time specification for the device. In conventional practice, these cells with the short data retention time cannot be utilized, as a consequence of which the device may provide insufficient memory cells and thus be rejected or categorized in a high self refresh current bin.

According to this aspect of the invention, a redundant word-line control circuit includes fuse boxes which are utilized to adjust the number of refresh cycles of normal and/or redundant rows of memory cells. As a result of this redundant word-line control circuit configuration, rows of memory cells which meet the retention duration specification receive a single refresh cycle during the retention period. However, rows of memory cells (original or replacement) which do not meet that retention duration specification are given additional refresh cycles during the retention period, thus overcoming the insufficiency of retention duration.

A novel redundant word-line control circuit is thus utilized which can generate additional refreshes within each retention period to overcome retention failings with either the original row (fuse set for refresh mode) or the redundant row (fuse set for replacement and refresh modes).

Figure 8:
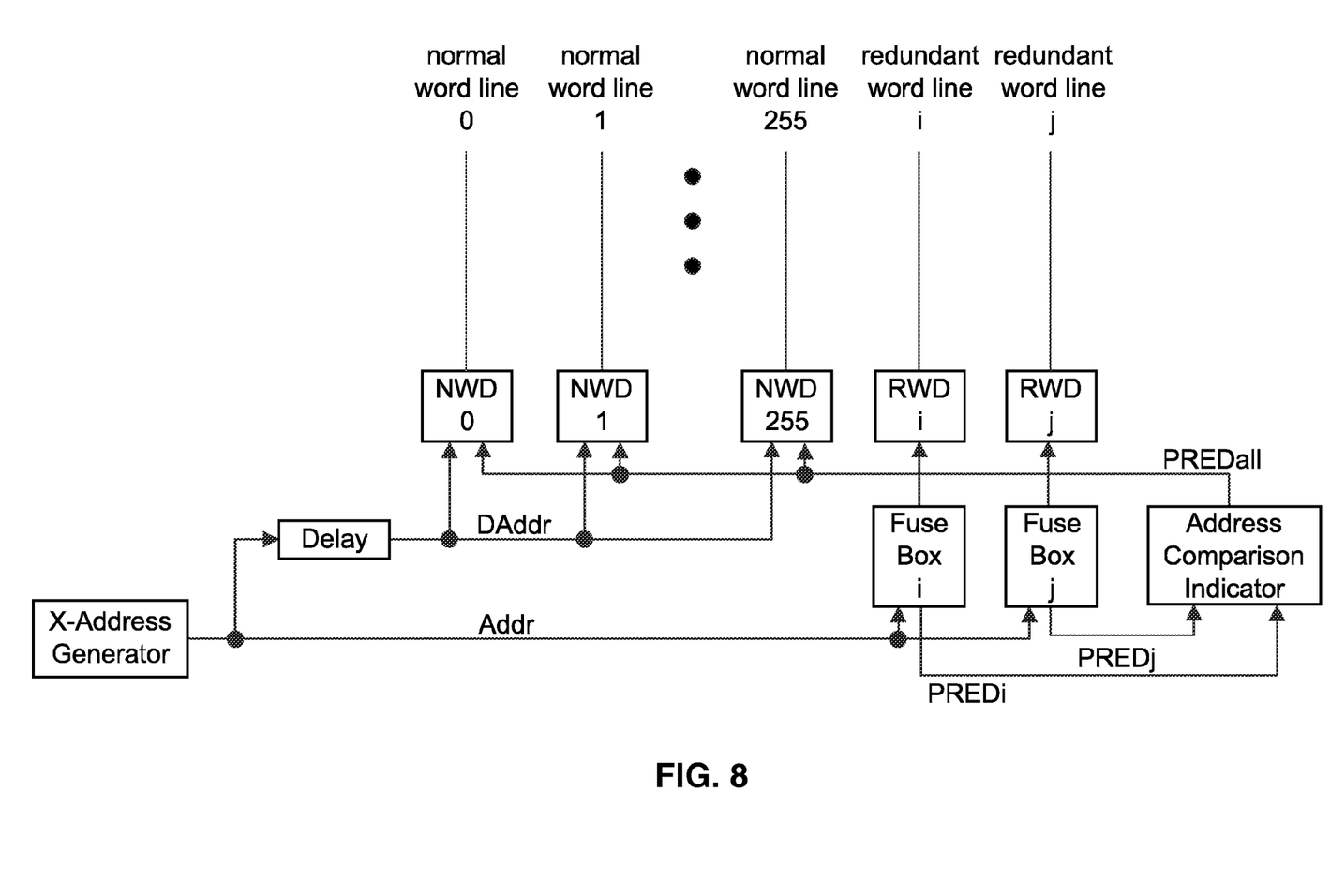
FIG. 8 is a schematic block diagram of a memory circuit having redundant word lines i and j.
Figure 9:
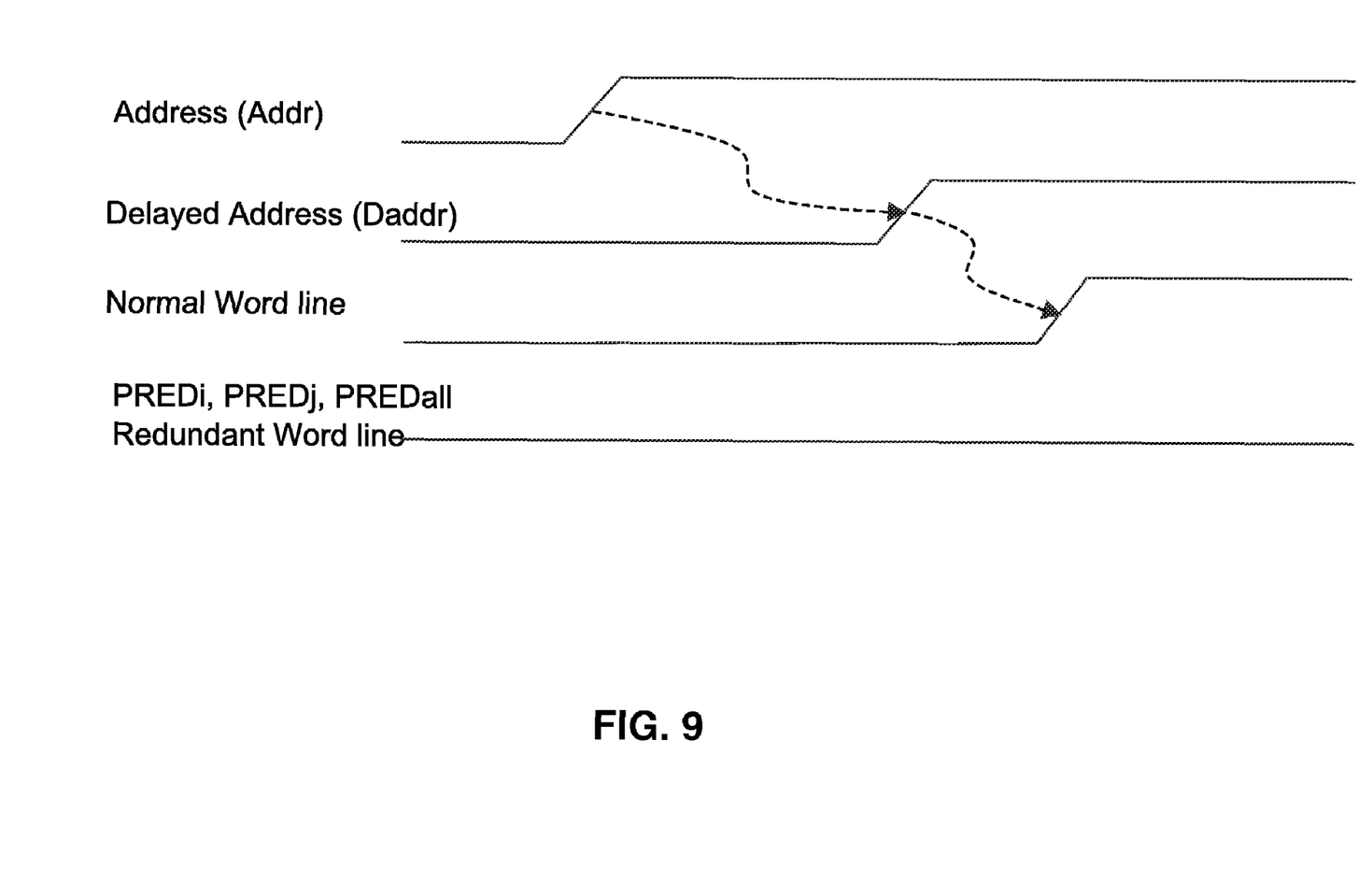
FIG. 9 is a timing diagram of word line enabling in the control circuit of FIG. 8.

FIG. 8 and FIG. 9 illustrate a conventional row redundancy control block and associated timing. The X-address generated by external inputs or by internal counters is provided to fuse boxes to check if an original row is replaced by a redundant row while delayed X-address is provided to NWDs (Normal Wordline Drivers) to enable a matched row. When an incoming X-address is not matched with row address information stored at the fuse boxes the delayed X-address activates one of NWD and a memory data read or write operation is performed. When an incoming X-address is matched with row address information stored at one of the fuse boxes, the fuse box generates a hit signal, PREDi (or PREDj), and an address comparison indicating signal, PREDall, is generated and inactivates all NWDs (NWD0 ~NWD255) before they are selected by delayed address (DAddr) and a matched RWDi (Redundant Wordline Driver or RWDj) is enabled, and a redundant word line is activated.

One issue arising with the conventional redundancy scheme is in relation to self refresh, since fuse boxes store only X-address information. A functionally defective original row is successfully replaced by a redundant row, however, if the data retention time of the redundant row is not sufficient to meet specification, the device may be rejected or degraded. In this invention, the redundant control circuit, in particular the fuse box, contains self refresh period information as well as X-address information to trigger an additional refresh operation of those cells exhibiting short data retention time. The fuse box also stores other flag bits telling whether or not stored self refresh period information is for an original row.

In order to configure the DRAM according to this method of mitigating retention period problems, the refresh control logic must be configured for generating the additional refresh cycles, while the fuses of redundant word-lines must be configured for storing both X-address information and word-line mode information comprising: unused, replacement, additional refresh, and combination of additional refresh and replacement.

For example, if the circuit associated with a redundant word-line control is not used to replace a defective cell for whatever reason, the fuse corresponding to that redundant word-line is left un-programmed, and thus marked "unused". This fuse can then be utilized for refresh period control by programming the X-address of the desired normal row, as well as setting the fuse to indicate the mode as unused and as additional refresh. The internal refresh control circuit recognizes the mode setting to properly generate the additional refresh cycles to improve overall refresh period of the row.

Figure 10:
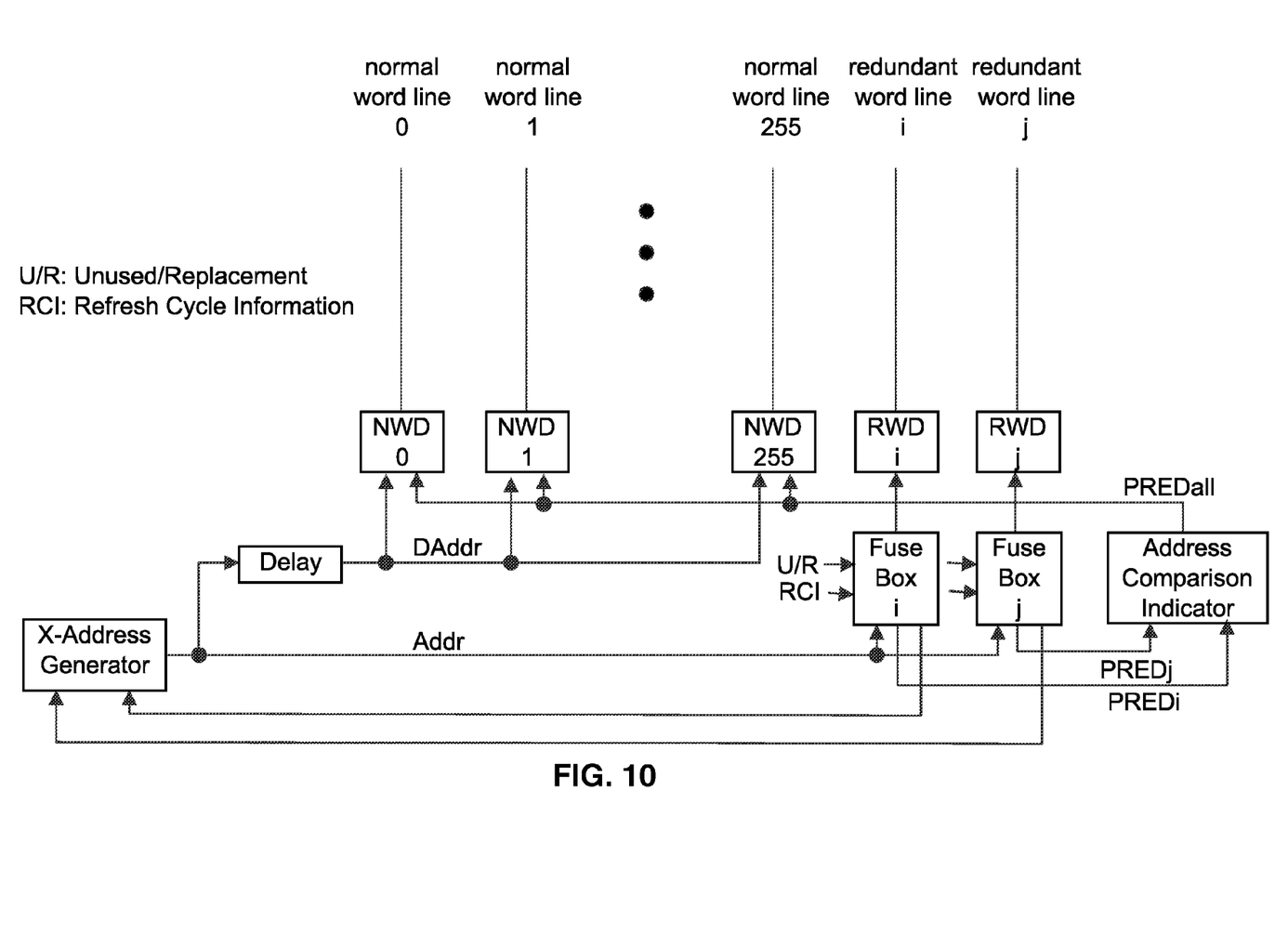
FIG. 10 is a schematic block diagram of a memory circuit having redundant word lines which can be utilized for redundant refresh operations according to an aspect of the present invention.

FIG. 10 illustrates a block diagram for an improved self refresh circuit.

If an address match occurs when the X-address of a normal word line is compared with information stored at the fuse box, then the fuse box generates a signal to control the address generator for the self refresh operation to refresh the corresponding address at least one more time during the refresh period in self refresh mode.

Figure 11:
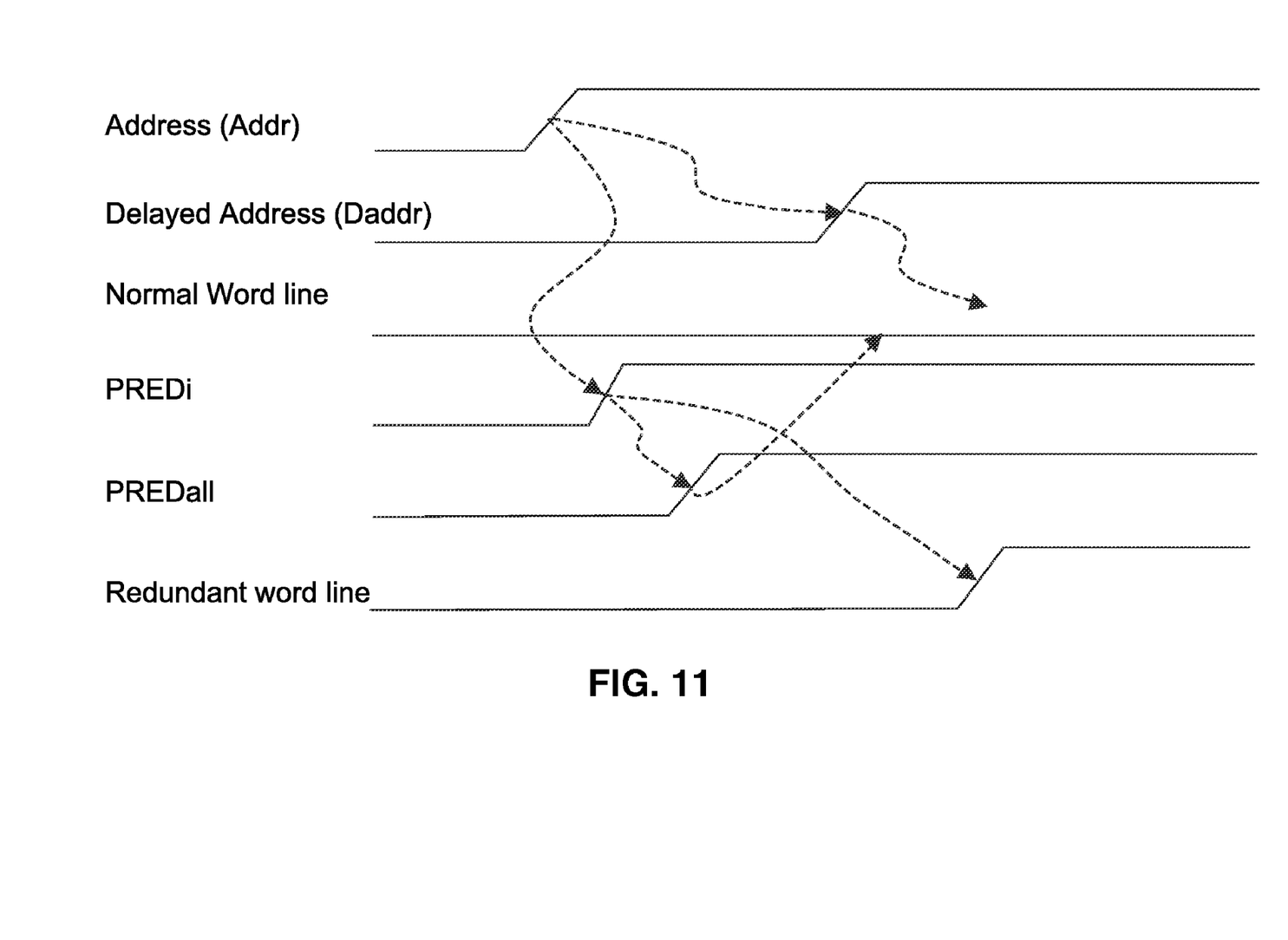
FIG. 11 is a timing diagram of word line enabling in the control circuit of FIG. 10.

FIG. 11 illustrates timing for the redundant word line enabling mechanism according to the present invention, in which the fuse mode is set to be "unused" and the corresponding redundant word line is not activated.

If the fuse box is utilized for replacing an original row with a redundant row, the fuse box is set as "replacement". When the incoming X-address is matched with address information stored at the fuse box, the fuse box generates a signal to disable the corresponding normal word line and activate the redundant word line as in the conventional scheme. It will be recognized that by adding the refresh period information to the fuse box, the control circuits can activate the redundant word line more often in self refresh mode.

Figure 12:
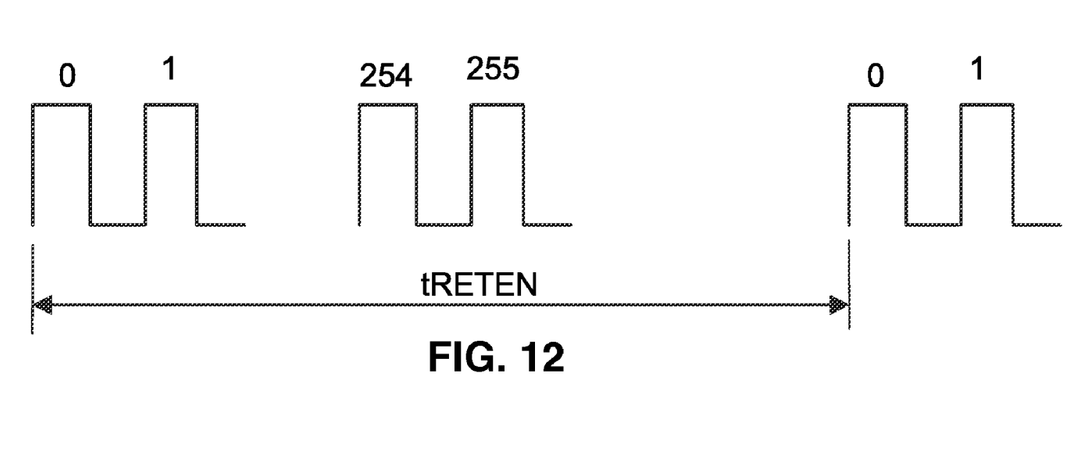
FIG. 12 is a timing diagram of self refresh cycles in which redundant cycles are not being generated.
Figure 13:
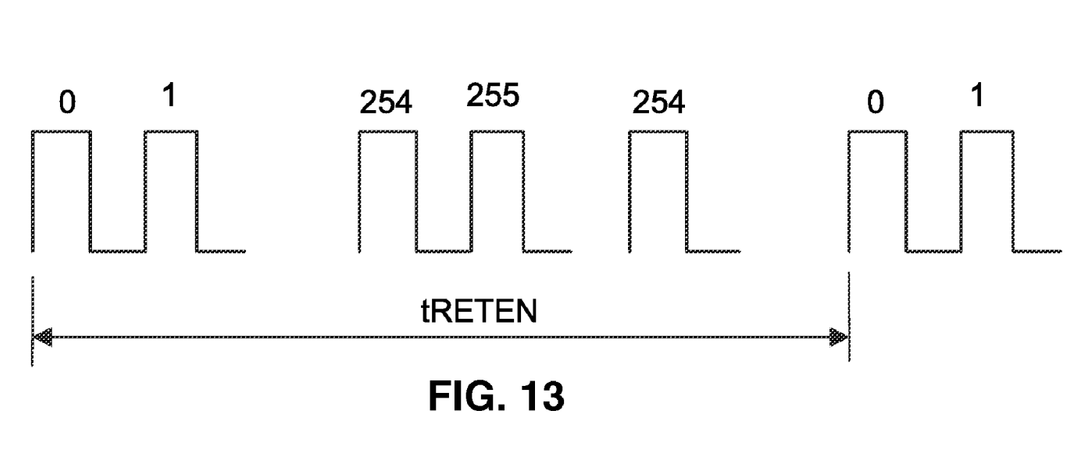
FIG. 13 is a timing diagram of self refresh cycles with redundant word line output being generated on word line 254.

FIG. 12 and FIG. 13 illustrate generation of memory refresh cycles. In FIG. 12 refresh timing (word lines 1-255) is shown within a refresh burst without the redundant self refresh. In FIG. 13 the redundant refreshing of word line 254 is shown displaced from the first activation of word line 254.

Therefore, by programming the redundant fuse box that signals refresh period control for the normal and/or redundant row with short cell data retention time, those rows can be refreshed more often within a given longer refresh period without limiting the refresh period. According to this refresh accommodation, self refresh power consumption can be reduced within a longer refresh period, instead of requiring the use of shorter refresh periods for all cells.

4. Controlling Bit-Line Sensing Level to Reduce Leakage Current.

Referring back to the DRAM circuit of FIG. 1, it is seen that the amount of electrical charge in the storage device determines whether it is storing a "High" or a "Low". Over time, the stored charge escapes through various leakage mechanisms until the read circuit can no longer properly detect the state of the stored data.

A method of increasing the storage time involves reducing cell channel leakage (i.e., NMOS off-leakage), which can be accomplished during self-refresh mode by keeping the voltage level of the bit-line that goes low during sensing at Vsg, where Vblp>Vsg>0 v.

Figure 14:
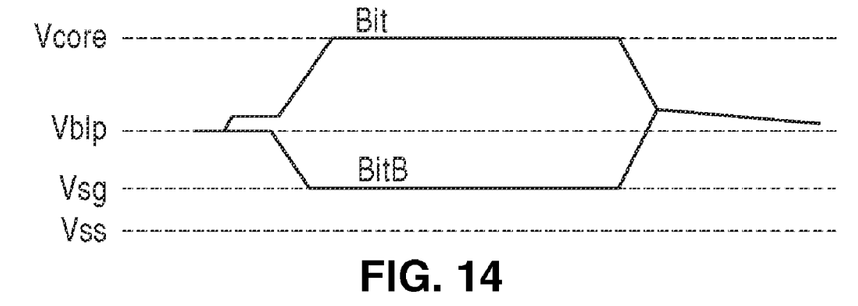
FIG. 14 is a timing diagram of conventional bit-line operation showing settling back to Vblp after access.

FIG. 14 depicts the bit-line at Vcore and BitB line is at Vsg after sensing. Therefore, after pre-charge, both the bit-line and BitB line will be at (Vcore+Vsg)/2 level which is higher than Vblp. Eventually, the Vblp generator will cause the bit-line and BitB line voltage level to settle at Vblp.

Factors determining the time required for the bit-line and BitB line to settle to Vblp include: bit-line capacitance, Vsg level, and the drivability of the Vblp generator. If the bit-line and the BitB line do not settle to Vblp level before the next charge-sharing operation, then this will reduce the sensing margin for "High" stored data.

Figure 15:
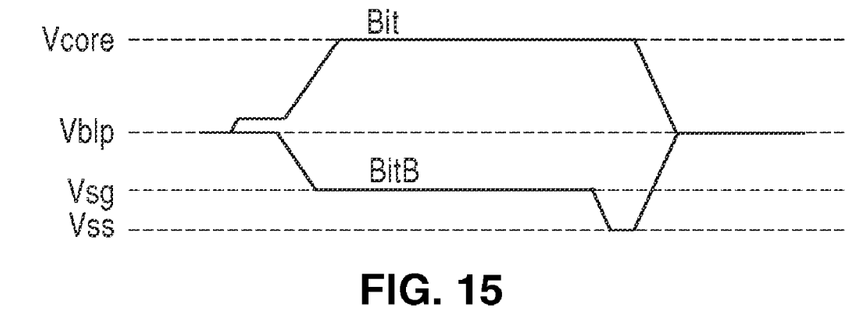
FIG. 15 is a timing diagram of an extended bit-line voltage scheme to speed bit-line settling back to Vblp after access according to an aspect of the present invention.

FIG. 15 illustrates a method of eliminating the potential for reduced sensing margin by bringing the bit-line or BitB line, that is at Vsg level after sensing (BitB line in FIG. 14), to 0V at a time before pre-charge occurs. In this case, the equalizing operation will cause the bit-line and BitB line to be at an equalized level of Vblp=Vcore/2.

Although the description above contains many details, these should not be construed as limiting the scope of the invention but as merely providing illustrations of some of the presently preferred embodiments of this invention.

Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A dynamic random access memory circuit (DRAM), comprising:
   a plurality of memory cells configured for retaining digital cell data in response to the level of stored charge;

a plurality of bit-lines and word-lines coupled to said plurality of memory cells for accessing cell data;

a refresh circuit configured for grouping refresh cycles into a portion of the data retention period;

a power control circuit configured for generating a power control signal for deactivating power when the memory circuit is not being accessed; and said power control circuit is configured for generating an active power level while the grouping of refresh cycles is being performed;

wherein each said refresh cycle comprises reading data from a memory cell followed by writing the same data back into the memory cell;

wherein said reading and writing is performed in response to modulation of bit-lines and word-lines of said memory circuit;

wherein said power control signal is not switched on and off for each refresh cycle within the data retention period;

wherein said grouping of refresh cycles are within a portion of the retention period that is less than half of the retention period; and wherein the refresh cycles are not evenly distributed over the data retention period.

2. A memory circuit as recited in claim 1, wherein the refresh cycles are controlled by self-refresh circuitry within said memory circuit which generates the timing of said refresh cycles within said portion of the data retention period.

3. A memory circuit as recited in claim 1, wherein a refresh cycle comprises refreshing a memory cell multiple times within a given data retention period.

4. A memory circuit as recited in claim 1, wherein said power control circuit is configured for generating one or more internal power control signals which are activated before a grouping of refresh cycles is performed, and deactivated afterward.

5. A dynamic random access memory circuit (DRAM), comprising:

a plurality of memory cells configured for retaining digital cell data in response to the level of stored charge;

a plurality of bit-lines and word-lines coupled to said plurality of memory cells for accessing cell data;

a refresh circuit configured for grouping refresh cycles into a portion of the data retention period;

a power control circuit configured for generating a power control signal for deactivating power when the memory circuit is not being accessed; and said power control circuit is configured for generating an active power level while the grouping of refresh cycles is being performed;

wherein each said refresh cycle comprises reading data from a memory cell followed by writing the same data back into the memory cell;

wherein said reading and writing is performed in response to modulation of bit-lines and word-lines of said memory circuit;

wherein said power control circuit is configured for generating one or more internal power control signals which are activated before a grouping of refresh cycles is performed, and deactivated afterward;

wherein each said internal power control signal comprises a signal that when activated turns on at least selected portions of internal power source switches, and when deactivated turns off at least selected portions of internal power source switches.

6. A memory circuit as recited in claim 5, wherein said internal power source transistors are composed of NMOS transistors, PMOS transistors, stacking NMOS transistors, stacking PMOS transistors, or a combination thereof.

7. A dynamic random access memory circuit (DRAM), comprising:

a plurality of memory cells configured for retaining cell data in response to the level of stored charge;

a plurality of word-lines coupled to cell arrays within said plurality of memory cells;

a plurality of bit-lines coupled through sense-amplifier arrays to said plurality of memory cells for accessing cell data;

a plurality of redundant memory cells and associated redundant word-lines which are enabled for replacing memory cells and word-lines which are defective; and a refresh control circuit configured for generating refresh cycles in which said plurality of memory cells are refreshed within a specified retention period;

wherein at least a portion of said redundant word-line control circuit is utilized to increase the number of refresh cycles generated during the retention period and directed to the associated rows of memory cells;

wherein a fuse is associated with each of said redundant word-lines;

said fuse is configured with an X-address and a means for indicating whether the word-line is unused, used for repair, used for refresh period control, or used for both repair and refresh period control;

wherein in response to said fuse for a given redundant word-line being set for refresh period control, or a combination of repair and refresh period control, said refresh control circuit is configured for utilizing said X-address for establishing an additional refresh cycle within each retention period for maintaining data within memory cells having an insufficient retention period.

8. A memory circuit as recited in claim 7, wherein said fuses are programmed with row repair information and information indicating that said fuses are being used for refresh period control in addition to row repair.

9. A memory circuit as recited in claim 8, wherein said information programmed in the fuses directs said refresh control circuit to refresh certain word-lines multiple times during one refresh cycle.

10. A memory circuit as recited in claim 8, wherein said information programmed in the fuses directs said refresh control circuit to refresh the repaired word-lines multiple times during one refresh cycle.

11. A dynamic random access memory circuit (DRAM), comprising:

a plurality of memory cells configured for retaining cell data in response to the level of stored charge;

a plurality of word-lines coupled to cell arrays within said plurality of memory cells;

a plurality of bit-lines coupled through sense-amplifier arrays to said plurality of memory cells for accessing cell data;

a refresh circuit configured for controlling refresh cycles in which said plurality of memory cells are refreshed within a retention period for the memory cells; and a means for changing the gate-to-source potential on at least one of the bit-lines near the conclusion of a memory cell precharge cycle;

wherein the difference in gate-to-source potential is controlled by a sensing circuit that reads data from the memory cell;

said sensing circuit comprises a CMOS latch;

said CMOS latch comprises power source transistors, ground source transistors, or a combination of power and ground source transistors;

wherein one of said ground source transistors couples a common node of two NMOS transistors of said CMOS latch to ground;

wherein said ground source transistors are NMOS transistors, PMOS transistors, a combination of NMOS and PMOS transistors, or a stacking of NMOS and PMOS transistors;

wherein the potential of said common node attains a precharge voltage level which is higher than ground potential and lower than Vcore during a precharge period of said DRAM;

wherein the potential of said common node attains a predetermined voltage level higher than ground potential and lower than the precharge voltage level during row activation for refresh and self-refresh operations; and wherein the potential of said common node attains approximately ground potential at a given time prior to a precharge operation.

12. memory circuit as recited in claim 11, wherein said at least one of the bit-lines comprises BitB whose voltage is changed from a voltage higher than Vss to Vss prior to the end of the precharge cycle.

13. A memory circuit as recited in claim 11, wherein a source potential of transistor switches, coupled to said plurality of memory cell, is higher than a gate potential of these transistor switches.

14. A memory circuit as recited in claim 13, wherein said source potential of the transistor switches is higher than zero volts.

15. A memory circuit as recited in claim 13, wherein said gate potential of the transistor switches is lower than or equal to zero volts.

16. A memory circuit as recited in claim 13, wherein the source potential of the transistor switches is higher than zero volts and the gate potential of the transistor switches is lower than or equal to zero volts.

17. A memory circuit as recited in claim 11, wherein said sensing circuit comprises a bit-line sense-amplifier.

18. A memory circuit as recited in claim 11, wherein the potential of said common node changes according to operating mode.

19. A memory circuit as recited in claim 11, wherein the potential of said common node attains a precharge voltage level which is higher than ground potential and lower than Vcore during a precharge period of said DRAM.

20. A memory circuit as recited in claim 19, wherein said precharge voltage level is Vcore/2.

21. A memory circuit as recited in claim 11, wherein the potential of said common node is approximately ground potential during row activation for data read or write operation.

* * * * *